United States Patent [19]

Taya et al.

[11] Patent Number: 4,766,396

[45] Date of Patent: Aug. 23, 1988

[54] CURRENT SOURCE TYPE CURRENT OUTPUT CIRCUIT USING CURRENT MIRRORS

[75] Inventors: Takashi Taya; Toshiyuki Tahara, both of Tokyo, Japan

[73] Assignee: Oki Electric Industry Co., Ltd., Tokyo, Japan

[21] Appl. No.: 82,648

[22] Filed: Aug. 7, 1987

[30] Foreign Application Priority Data

Aug. 28, 1986 [JP] Japan .................................. 61-199994

[51] Int. Cl.$^4$ ............................................... H03F 1/34
[52] U.S. Cl. ..................................... 330/288; 330/105; 330/106; 330/293
[58] Field of Search ............... 330/105, 106, 257, 260, 330/288, 293; 323/315, 316

[56] References Cited

U.S. PATENT DOCUMENTS 4,290,024 9/1981 Yokoyama ...................... 330/105 X

OTHER PUBLICATIONS

"Design of OP AMP Circuit (Revised)", by Nobuo Okamura, published by CQ Publishing Co., Ltd., Tokyo, Japan, pp. 87-88, Aug. 10, 1973.
"A High-Voltage IC for a Transformerless Trunk and Subscriber Line Interface", by Denis W. Aull et al., IEEE Journal of Solid-State Circuits, vol. SC-16, No. 4, pp. 261-265, Aug. 1981.

Primary Examiner—James B. Mullins
Attorney, Agent, or Firm—Wenderoth, Lind & Ponack

[57] ABSTRACT

A current source type current output circuit for applying to a load a current which is proportional to an input includes an amplifier of the type receiving a current and producing a voltage, and a feedback circuit for feeding back an output of the amplifier to an input terminal of the amplifier. The feedback circuit is made up of a first, a second, and a third current mirror circuit, and a first, a second, and a third resistor. An output terminal of the amplifier is connected to an input terminal of the second current mirror circuit via the third resistor and to an input terminal of the first current mirror circuit via a series connection of the first and second resistors. The load is connected to the intermediate point of the serial connection of the first and second resistors. An output terminal of the second current mirror circuit is connected to an input terminal of the third current mirror circuit. Output terminals of the first and third current mirror circuits are connected to an input terminal of the amplifier such that a current which is proportional to an input is fed to the load. A reference terminal of each of the first and second current mirror circuits is connected to a first power source, and a reference terminal of the third current mirror circuit is connected to a second power source.

4 Claims, 2 Drawing Sheets

CURRENT SOURCE TYPE CURRENT OUTPUT CIRCUIT USING CURRENT MIRRORS

BACKGROUND OF THE INVENTION

1. Field of the Invention

The present invention relates to a current source type current output circuit and, more particularly, to a circuit for applying to a load a constant output current which is proportional to an input voltage or an input current, with no regard to the character of the load.

2. Description of the Prior Art

A current source type current output circuit is disclosed in, for example, Michio Okamura "DESIGN OF OP AMP CIRCUIT (REVISED)," published Aug. 10, 1973 by CQ Publishing Co., Ltd., Tokyo, Japan, pp. 87 and 88. The principle of such a prior art current source type current output circuit is shown in FIG. 2. The circuit of FIG. 2 includes a voltage-input voltage-output type operational amplifier (op amp) A1 which is adapted to produce an output voltage by multiplying an input voltage by a predetermined gain A1. The output B of the op amp A1 is connected to an output terminal C of the circuit via a resistor R11. Connected to the output terminal C is a circuit L1 which constitutes a load of the circuit. The inverting input D of the op amp A1 is connected on one hand to the output terminal B of the op amp A1 via a resistor R13 and on the other hand to an input signal voltage source V12 via a resistor R14. Likewise, the non-inverting input E of the op amp A1 is connected on one hand to the output terminal C of the current output circuit via a resistor R12 and on the other hand to ground via a resistor R15.

In the prior art current output circuit shown and described, assuming that the absolute value of the gain A1 of the op amp A1 is sufficiently large, and that the resistors R11, R12, R13, R14 and R15 are related to each other as represented by:

$$R14 \cdot (R11 + R12) = R13 \cdot R15 \qquad \text{Eq. (1)}$$

then, the output current I13 of the circuit is produced by:

$$I13 = -\frac{R13}{R11 \cdot R14} \cdot V12 \qquad \text{Eq. (2)}$$

Hence, an output current I13 which is proportional to an input signal voltage V12 is obtained. Although the characteristic of the load L1 of the current output circuit may be changed to in turn change the potential V11 which appears on the output terminal C, the Eq. (2) is maintained so long as the relation as represented by the Eq. (1) is satisfied. In this condition, the current output circuit succeeds in feeding a constant current to the load L.

However, a drawback with the prior art current source type current output circuit discussed above is that as many as five resistors having accuracy which satisfies the previously stated Eq. (1) are installed. As regards an integrated circuit, since such resistors with substantial accuracy occupy a substantial volume, it is impractical to configure the prior art current output circuit in a miniature and dense arrangement.

SUMMARY OF THE INVENTION

It is therefore an object of the present invention to provide a current source type current output circuit which is simple in construction and suitable for a miniature and dense design.

In order to achieve the above object, a current source type current output circuit for applying to a load a current which is proportional to an input of the present invention includes an amplifier of the type receiving a current and producing a voltage, i.e., transimpedance amplifier, and a feedback circuit for feeding back an output of the amplifier to an input terminal of the amplifier. The feedback circuit is made up of a first, a second, and a third current mirror circuit, and a first, a second, and a third resistor. An output terminal of the amplifier is connected to an input terminal of the second current mirror circuit via the third resistor and to an input terminal of the first current mirror circuit via a series connection of the first and second resistors. The load is connected to the intermediate point of the serial connection of the first and second resistors. An output terminal of the second current mirror circuit is connected to an input terminal of the third current mirror circuit. Output terminals of the first and third current mirror circuits are connected to the input terminal of the amplifier such that a current which is proportional to an input is fed to the load. A reference terminal of each of the first and second current mirror circuits is connected to a first power source, and a reference terminal of the third current mirror circuit is connected to a second power source.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

Figure 1:
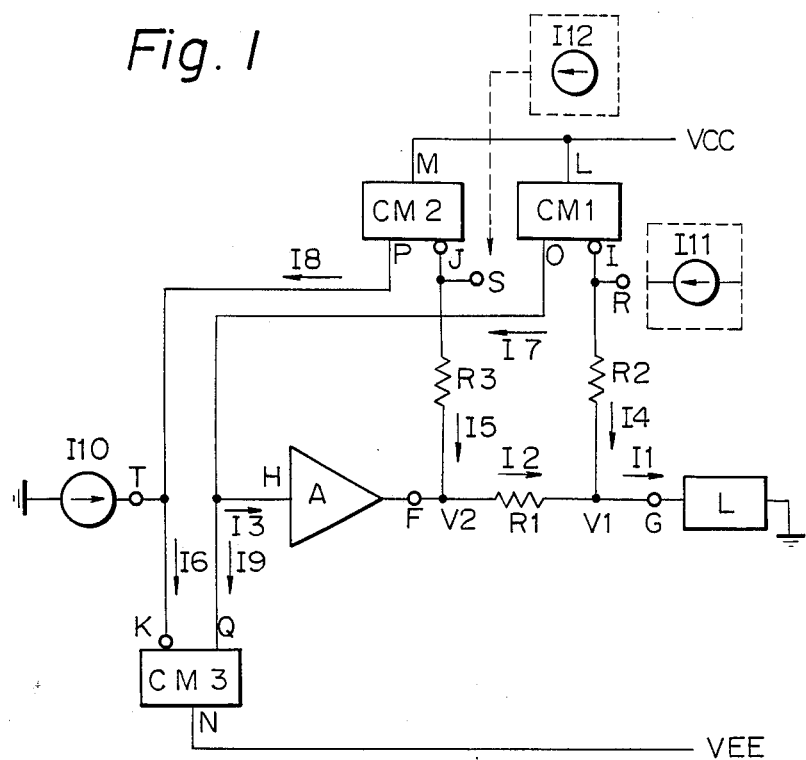
FIG. 1 is a schematic block diagram showing a current source type current output circuit in accordance with the present invention.
Figure 2:
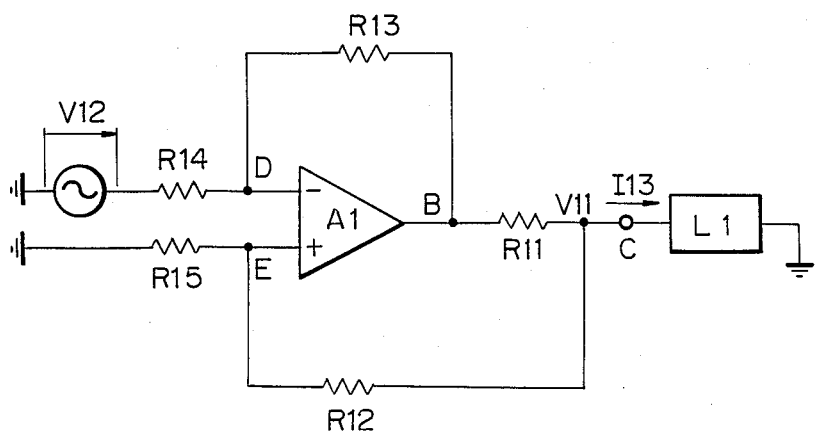
FIG. 2 is a schematic circuit diagram showing an example of prior art current source type current output circuits.

Referring to FIG. 1 of the drawings, a current source type current output circuit embodying the present invention is shown. As shown, the current output circuit includes an amplifier A which is implemented with a transimpedance amplifier circuit, i.e. current-input voltage-output type amplifier circuit. The output F of the amplifier A is connected to an output terminal G of the current output circuit via a resistor R1 while a circuit L is connected to the output terminal G to serve as a load. A resistor R2 is connected at one terminal thereof to the output terminal G and at the other terminal to an input terminal I of a current mirror circuit CM1. A resistor R3 is connected at one terminal thereof to the output terminal F of the amplifier A and at the other terminal to an input terminal J of another current mirror circuit CM2. The reference terminals L and M of the current mirror circuits CM1 and CM2, respectively, are connected to a first power source VCC both. The output terminal P of the current mirror circuit CM2 is coupled to an input terminal K of a farther current mirror circuit CM3, the reference terminal N of the current mirror circuit CM3 being connected to a second power source VEE. The output terminals O and Q of the current mirror circuits CM1 and CM3, respectively, are connected to each other and to an input terminal H of the amplifier A.

In this particular embodiment, the current output circuit is provided with three input terminals to which an input signal current may be applied. The input terminals R, S and T are connected to, respectively, the input terminal I of the current mirror circuit CM1, the input terminal J of the current mirror circuit CM2, and the input terminal K of the current mirror circuit CM3. The input signal, which in this embodiment is fed as a current, is applied to any one, two or three of the input terminals R, S and T. FIG. 1 shows a situation wherein an input signal current I10 is applied to the input terminal T by way of example.

The label I1 designates a current flowing through the output terminal G of the current output circuit, I2 a current flowing through the resistor R1, I3 a current input to the amplifier A, I4 an input current applied to the current mirror circuit CM1, I5 an input current applied to the current mirror circuit CM2, I6 an input current applied to the current mirror circuit CM3, I7 an output current from the current mirror circuit CM1, I8 an output current from the current mirror circuit CM2, I9 an output current from the current mirror circuit CM3, and I10 the input signal current. Further, labeled V1 is a potential appearing on the output terminal G, V2 a potential on the output terminal F of the amplifier A, VCC a potential of the first power source, and VEE a potential of the second power source. The ratio of the output voltage to the input current, i.e., gain or transresistance of the amplifier A is assumed to be A, and its sign is assumed to be negative. The ratio of the output current to the input current of each of the current mirror circuits CM1, CM2 and CM3 is assumed to be 1.

The operation of the current output circuit shown in FIG. 1 will be outlined assuming a condition in which the potential V1 on the output terminal G is lowered due to a change in the characteristic of the load L. For the simplicity of description, assume that the resistors R2 and R3 have the same resistance, and that the resistance of the resistor R1 is sufficiently smaller than that of the resistors R2 and R3. Details of the operation in such a condition will be precisely explained by use of equations later.

As the characteristic of the load L is changed to in turn change the potential V1 on the output terminal G of the current output circuit, the potential difference between the first power source VCC and the potential V1 on the output terminal G is increased and, as a result, the input current I4 to the current mirror circuit CM1 is increased. Since the output current I7 from the current mirror circuit CM1 is equal to the input current I4, the output current I7 is increased. Then, assuming that the output current I9 of the current mirror circuit CM3 does not change, the input current I3 to the amplifier A tends to increase in response to the increase in the current I7. However, since the sign of the gain A of the amplifier A is negative, the output voltage V2 of the amplifier A is lowered. Consequently, the potential difference between the first power source VCC and the potential V2 on the output terminal F of the amplifier A is increased to in turn increase the input current I5 to the current mirror circuit CM2. Since the output current I8 from the current mirror circuit CM2 is equal to the input current I5, the input current I6 to the current mirror circuit CM3 is increased. In response, the output current I9 from the current mirror circuit CM3 which is equal to the input current I6 is increased. The increase in the output current I9 from the current mirror circuit CM3 results in a decrease in the input current I3 to the amplifier A. Assuming that the gain of the amplifier A, i.e., the absolute value of the ratio of the output voltage V2 to the input current I3 of the amplifier A is extremely great, the circuit operates such that the change in the input voltage I3 to the amplifier A becomes zero.

As previously stated, a decrease in the potential V1 on the output terminal G causes the input current I3 to the amplifier A to increase, and a decrease in the potential V2 of the output F of the amplifier A causes the input current I3 to decrease. It follows that the amount of drop of the potential V1 on the output terminal G is equal to that of drop of the potential V2 of the output F of the the amplifier A. Hence, the potential difference beween both ends of the resistor R1 and, therefore, the current I2 flowing through the resistor R1 is maintained constant. In this particular embodiment, since the resistance of the resistor R1 is assumed to be sufficiently smaller than that of the resistors R2 and R3, it may be regarded that the current I4 flowing through the resistor R2 is sufficiently smaller than the current I2 which flows through the resistor R1, and that the current I1 flowing toward the load L is equal to the current I2 which flows through the resistor R1. Consequently, the current I1 flowing through the load L remains constant. The same holds true with a case wherein the potential on the output terminal G is increased due to a change in the characteristic of the load L.

The operation of the circuit shown in FIG. 1 will hereinafter be explained by using equations.

In the circuit of FIG. 1, the various constants and variables are related as represented by the following equations:

$$I1 = I2 + \frac{VCC - V1}{R2} \qquad \text{Eq. (3)}$$

$$I2 = \frac{1}{R1}(V2 - V1) \qquad \text{Eq. (4)}$$

$$I3 = \frac{VCC - V1}{R2} - \frac{VCC - V2}{R3} - I10 \qquad \text{Eq. (5)}$$

$$V2 = A \cdot I3 \qquad \text{Eq. (6)}$$

Eliminating V2, I2 and I3 of the Eqs. (3) to (6), there is produced:

$$I1 = \frac{I10}{\left(\frac{R1}{R3} - \frac{R1}{A}\right)} + \qquad \text{Eq. (7)}$$

$$\frac{\left(\frac{R1}{R2 \cdot A} + \frac{1}{A}\right) + \left(\frac{1}{R2} - \frac{R1}{R2 \cdot R3} - \frac{1}{R3}\right)}{\left(\frac{R1}{R3} - \frac{R1}{A}\right)} V1 +$$

$$\frac{-\frac{R1}{R2 \cdot A} - \left(\frac{1}{R2} - \frac{R1}{R2 \cdot R3} - \frac{1}{R3}\right)}{\left(\frac{R1}{R3} - \frac{R1}{A}\right)} VCC$$

So long as the absolute value of the gain or transresistance A of the amplifier A is sufficiently large and the resistance values of the resistors R1, R2 and R3 are so selected as to satisfy a relation:

$$\frac{1}{R2} - \frac{R1}{R2 \cdot R3} - \frac{1}{R3} = 0 \qquad \text{Eq. (8)}$$

the second and third terms of the right member of the Eq. (7) may be regarded as zero each. Therefore, the output current I1 of the circuit shown in FIG. 1 is produced as:

$$I1 = \frac{R3}{R1} \cdot I10 \qquad \text{Eq. (9)}$$

It will be seen that so long as the above-stated two conditions are satisfied, the relationship represented by the Eq. (9) holds true even through the characteristic of the load L and, therefore, the potential V1 on the output terminal G may be changed, allowing the circuit of FIG. 1 to feed a constant current to the load L without fail.

The Eq. (8) may be modified as follows:

$$R3 = R1 + R2 \qquad \text{Eq. (10)}$$

This implies that if the absolute value of the gain A of the amplifier A is selected to be sufficiently large and, at the same time, if the relative values of the three resistors R1, R2 and R3 are accurately matched to satisfy the Eq. (10), the circuit of FIG. 1 serves the expected constant-current feeding function.

The mathematical analysis of the operation described above also applies to input signal currents to the input terminals R and S which are labeled I11 and I12, respectively. Specifically, so long as the Eq. (10) is satisfied and the gain A of the amplifier A is sufficiently large, an output current I1 which is proportional to any of the input signal currents I11 and I12 is achievable, as shown below:

$$I1 = -\frac{R3}{R1} \cdot I11 \qquad \text{Eq. (11)}$$

$$I1 = \frac{R3}{R1} \cdot I12 \qquad \text{Eq. (12)}$$

Figure 3:
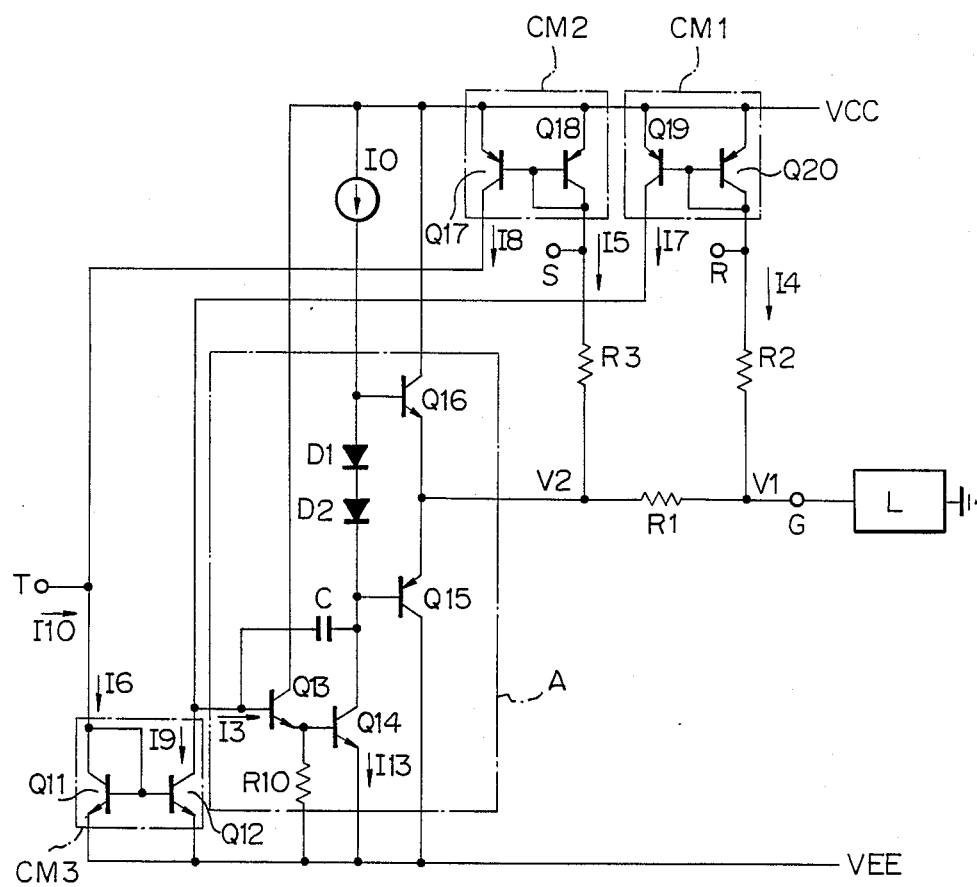
FIG. 3 is a circuit diagram showing a specific construction of the current source type current output circuit of the present invention.

Referring to FIG. 3, a specific circuit arrangement embodying the present invention is shown. As shown, the circuit includes transistors Q13, Q14, Q15, and Q16, diodes D1 and D2, a resistor R10, a capacitor C, and a constant current source I0, which in combination serve the function of the amplifier A as shown in FIG. 1. A circuit constituted by transistors Q19 and Q20, a circuit constituted by transistors Q17 and Q18, and a circuit constituted by transistors Q11 and Q12 correspond, respectively, to the current mirror circuits CM1, CM2 and CM3 of FIG. 1.

In FIG. 3, the current I4 flows between the emitter and the collector of the transistor Q20 due to the potential difference which is developed between the first power source VCC and the output voltage V1 of the circuit. Hence, the current I7 which is equal to the current I4 is caused to flow between the emitter and the collector of the transistor Q19. Likewise, the current I5 flows between the emitter and the collector of the transistor Q18 due to the potential difference between the power source VCC and the output voltage V2 of the amplifier A, causing the current I8 equal to the current I5 to flow between the emitter and the collector of the transistor Q17. The current I6 which is the sum of the current I8 and the input signal current I10 flows between the collector and the emitter of the transistor Q11. As a result, the current I9 which is equal to the current I6 flows between the collector and the emitter of the transistor Q12. The input current I3 to the amplifier A is a current produced by subtracting the current I9 from the current I7. Hence, the input current I3 is a current produced by subtracting the currents I5 and I10 from the current I4.

The transistors Q13 and Q14 are connected together in, for example, a Darlington configuration. Specifically, as the base current I3 flows through the transistor Q13, a current I13 is caused to flow between the collector and the emitter of the transistor Q14. When the current I13 flowing between the collector and the emitter of the transistor Q14 is changed, the output potential V2 of the amplifier A is increased or decreased by the transistors Q15 and Q16. Consequently, the output voltage V2 of the amplifier A is varied by the currents I4 and I5 and the input signal current I10.

As described above in detail, a current source type current output circuit of the present invention feeds back an output current to a current-input voltage-output type amplifier circuit by use of only three resistors which require high relative accuracy. This is contrastive to the prior art circuit which needs five such resistors. The decrease in the number of resistors which have to satisfy a predetermined condition as stated above promotes the ease of production of the circuit. Especially, an integrated configuration of the circuit would contribute a great deal to miniaturization and dense arrangement.

While the present invention has been described with reference to the particular illustrative embodiment, it is not to be restricted by that embodiment but only by the appended claims. It is to be appreciated that those skilled in the art can change or modify the embodiment without departing from the scope and spirit of the present invention.

What is claimed is:

1. A current source type current output circuit for applying to a load a current which is proportional to an input, comprising:
   an amplifier of a type receiving a current and producing a voltage; and
   a feedback circuit for feeding back an output of said amplifier to an input terminal of said amplifier;
   said feedback circuit comprising a first, a second, and a third current mirror circuit, and a first, a second, and a third resistor;
   an output terminal of said amplifier being connected to an input terminal of said second current mirror circuit via said third resistor and to an input terminal of said first current mirror circuit via a series connection of said first and second resistors;
   the load being connected to an intermediate point of said serial connection of said first and second resistors;
   an output terminal of said second current mirror circuit being connected to an input terminal of said third current mirror circuit;
   an output terminal of said first current mirror circuit and an output terminal of said third current mirror circuit being connected to said input terminal of said amplifier such that a current which is proportional to an input is fed to the load;
a reference terminal of each of said first and second current mirror circuits being connected to a first power source, and a reference terminal of said third current mirror circuit being connected to a second power source.

2. A current output circuit in accordance with claim 1, wherein said amplifier is provided with a significantly extremely large amplification gain, and a sum of resistance values of said first and second resistors is substantially equal to a resistance value of said third resistor.

3. A current output circuit in accordance with claim 2, wherein said input signal current is applied to at least one of said input terminals of said first, second and third current mirror circuits.

4. A current source type current output circuit for applying to a load a current which is proportional to an input, comprising:
   a first, a second, and a third input terminal for receiving the input;
   a first output terminal to which the load is connected;
   an amplifier means having a negative transresistance an absolute value of which is large and comprising a fourth input terminal for receiving a current, and a second output terminal for producing a voltage; and
   a feedback means for feeding back an output from said second output terminal to said fourth input terminal;
   said feedback means comprising a first, a second, and a third current mirror circuit, and a first, a second, and a third resistor;
   said first resistor connecting said second output terminal to said first output terminal;
   said third resistor having a resistance value which is substantially equal to a sum of resistance values of said first and second resistors;
   said first current mirror circuit having an input which is connected to said first output terminal via said second resistor, and to said first terminal, an output connected to said fourth input terminal, and a reference terminal connected to a first power source;
   said second current mirror circuit having an input which is connected to said second output terminal via said third resistor, and to said second input terminal, an output which is connected to said third input terminal, and a reference terminal which is connected to said first power source;
   said third current mirror circuit having an input which is connected to said third input terminal, an output which is connected to said fourth input terminal, and a reference terminal which is connected to a second power source.

* * * * *